United States Patent
Park et al.

(10) Patent No.: US 12,500,110 B2
(45) Date of Patent: Dec. 16, 2025

(54) SUBSTRATE PROCESSING APPARATUS

(71) Applicant: SEMES CO., LTD., Cheonan-si (KR)

(72) Inventors: Junseok Park, Cheonan-si (KR); Chulho Jung, Pyeongtaek-si (KR); Jongjoon Jeon, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 228 days.

(21) Appl. No.: 18/199,242

(22) Filed: May 18, 2023

(65) Prior Publication Data
US 2023/0377931 A1    Nov. 23, 2023

(30) Foreign Application Priority Data
May 23, 2022    (KR) .................... 10-2022-0063050

(51) Int. Cl.
*H01L 21/683*    (2006.01)
(52) U.S. Cl.
CPC ...... *H01L 21/6833* (2013.01); *H01L 21/6838* (2013.01)
(58) Field of Classification Search
CPC ............ H01L 21/683; H01L 21/6833; H01L 21/6838; H01L 21/67103; H01L 21/6831; H01L 21/67109; H01L 21/68735; H01L 21/68785; H01L 21/68757; H02N 13/00
USPC ...................................................... 361/234
See application file for complete search history.

(56) References Cited

U.S. PATENT DOCUMENTS

| | | | |
|---|---|---|---|
| 6,558,508 B1 | 5/2003 | Kawakami | |
| 6,853,533 B2 | 2/2005 | Parkhe | |
| 10,497,597 B2 | 12/2019 | Lee et al. | |
| 11,011,405 B2 | 5/2021 | Lee et al. | |
| 2006/0279899 A1* | 12/2006 | Aihara | H01L 21/6831 361/234 |
| 2010/0193491 A1 | 8/2010 | Cho et al. | |
| 2010/0194012 A1* | 8/2010 | Tatsumi | H01L 21/6838 269/21 |
| 2013/0181038 A1 | 7/2013 | Elliot et al. | |
| 2016/0276196 A1 | 9/2016 | Parkhe | |
| 2017/0256431 A1* | 9/2017 | Parkhe | H01L 21/67103 |
| 2019/0148206 A1 | 5/2019 | Yamaguchi et al. | |
| 2019/0189491 A1* | 6/2019 | Akatsuka | H01L 21/67103 |

FOREIGN PATENT DOCUMENTS

| | | |
|---|---|---|
| KR | 1020010080296 A | 8/2001 |
| KR | 1020010111058 A | 12/2001 |
| KR | 1020090024866 A | 3/2009 |
| KR | 1020110101365 A | 9/2011 |

(Continued)

OTHER PUBLICATIONS

Office Action dated Feb. 16, 2024 for corresponding KR Patent Application No. 10-2022-0063050.

*Primary Examiner* — Danny Nguyen

(74) *Attorney, Agent, or Firm* — Muir Patent Law, PLLC

(57) ABSTRACT

Provided is a substrate processing apparatus. The substrate processing apparatus includes a support plate configured to support a substrate, a base plate under the support plate, a thermal insulation layer between the support plate and the base plate, and a bonder bonding the base plate and the thermal insulation layer to each other, wherein the thermal insulation layer is brought into tight contact with a lower end surface of the support plate by using a bolt.

18 Claims, 8 Drawing Sheets

(56) References Cited

FOREIGN PATENT DOCUMENTS

| KR | 101458864 B1 | 11/2014 |
|---|---|---|
| KR | 1020170128585 A | 11/2017 |
| KR | 1020180021301 A | 3/2018 |
| KR | 101898238 B1 | 9/2018 |
| KR | 1020190016098 A | 2/2019 |
| KR | 1020200042330 B1 | 4/2020 |
| KR | 1020210120553 A | 10/2021 |
| KR | 1020210137631 A | 11/2021 |

* cited by examiner

SUBSTRATE PROCESSING APPARATUS

CROSS-REFERENCE TO RELATED APPLICATION

This application is based on and claims priority under 35 U.S.C. § 119 to Korean Patent Application No. 10-2022-0063050, filed on May 23, 2022, in the Korean Intellectual Property Office, the disclosure of which is incorporated by reference herein in its entirety.

BACKGROUND

1. Field

The disclosure relates to a substrate processing apparatus, and more particularly, to a substrate processing apparatus having improved reliability.

2. Description of the Related Art

In general, semiconductor devices may be manufactured through various processes such as an oxidation process, a photolithography process, an etching process, and a deposition process. Semiconductor manufacturing equipment may include a substrate processing apparatus configured to process substrates during various processes.

Several fabrication techniques, which have been developed and researched for next-generation devices, require processing at temperatures above 300 degrees Celsius. However, a bonder used in a normal substrate processing apparatus for bonding a base plate and a support plate to each other is vulnerable to high temperatures, and thus the adhesive strength of the bonder may decrease or the bonder may be bent at high temperatures.

SUMMARY

Provided is a substrate processing apparatus that is configured to stably operate at high temperatures and has improved reliability.

Additional aspects will be set forth in part in the description which follows and, in part, will be apparent from the description, or may be learned by practice of the presented embodiments of the disclosure.

According to an aspect of the disclosure, a substrate processing apparatus includes a support plate configured to support a substrate, a base plate under the support plate, a thermal insulation layer between the support plate and the base plate, and a bonder bonding the base plate and the thermal insulation layer to each other, wherein the thermal insulation layer is brought into tight contact with a lower end surface of the support plate by using a bolt.

In embodiments, a tube including an internal thread may be brazed to a lower end of the support plate, and the bolt may be fastened to the tube.

In embodiments, the support plate may include a DC electrode configured to fix the substrate supported on an upper end of the support plate by using electrostatic force.

In embodiments, the support plate may include a radio frequency (RF) layer configured to form an electromagnetic field by receiving power from an RF power source.

In embodiments, the support plate may include a ceramic material.

In embodiments, at least one gas supply hole may be formed in the support plate to supply a temperature control gas through the at least one gas supply hole, and the at least one gas supply hole may be horizontally surrounded by a dam.

In embodiments, at least one suction hole may be formed in an upper end of the thermal insulation layer to fix the support plate by vacuum suction, wherein the substrate processing apparatus may further include a vacuum pump communicating with the at least one suction hole to form a vacuum pressure in the at least one suction hole.

According to another aspect of the disclosure, a substrate processing apparatus includes a support plate configured to support a substrate, a base plate under the support plate, a thermal insulation layer between the support plate and the base plate, and a bonder bonding the base plate and the thermal insulation layer to each other, wherein the thermal insulation layer is brought into tight contact with the support plate by using a bolt, and the support plate includes a plurality of heating electrodes that are laterally arranged.

In embodiments, a tube including an internal thread may be brazed to a lower end of the support plate, and the bolt may be fastened to the tube.

In embodiments, the support plate may include a DC electrode configured to fix the substrate supported on an upper end of the support plate by using electrostatic force.

In embodiments, the support plate may include a radio frequency (RF) layer configured to form an electromagnetic field by receiving power from an RF power source.

In embodiments, the support plate may include a ceramic material.

In embodiments, at least one gas supply hole is formed in the support plate to supply a temperature control gas through the at least one gas supply hole, and the at least one gas supply hole may be horizontally surrounded by a dam.

In embodiments, at least one suction hole may be formed in an upper end of the thermal insulation layer to fix the support plate by vacuum suction, wherein the substrate processing apparatus may further include a vacuum pump communicating with the at least one suction hole to form a vacuum pressure in the at least one suction hole.

According to another aspect of the disclosure, a substrate processing device includes a support plate configured to support a substrate, a base plate under the support plate, a thermal insulation layer between the support plate and the base plate, a bonder bonding the base plate and the thermal insulation layer to each other, and a mechanical joint layer brazed to a lower end surface of the support plate, wherein the thermal insulation layer is brought into tight contact with a lower end surface of the mechanical joint layer by using a bolt.

In embodiments, the support plate may include a DC electrode configured to fix the substrate supported on an upper end of the support plate by using electrostatic force.

In embodiments, the support plate may include a radio frequency (RF) layer configured to form an electromagnetic field by receiving power from an RF power source.

In embodiments, the support plate may include a ceramic material.

In embodiments, at least one gas supply hole may be formed in the support plate to supply a temperature control gas through the at least one gas supply hole, and the at least one gas supply hole may be horizontally surrounded by a dam.

In embodiments, at least one suction hole may be formed in an upper end of the thermal insulation layer to fix the support plate by vacuum suction, wherein the substrate processing apparatus may further include a vacuum pump communicating with the at least one suction hole to form a vacuum pressure in the at least one suction hole.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
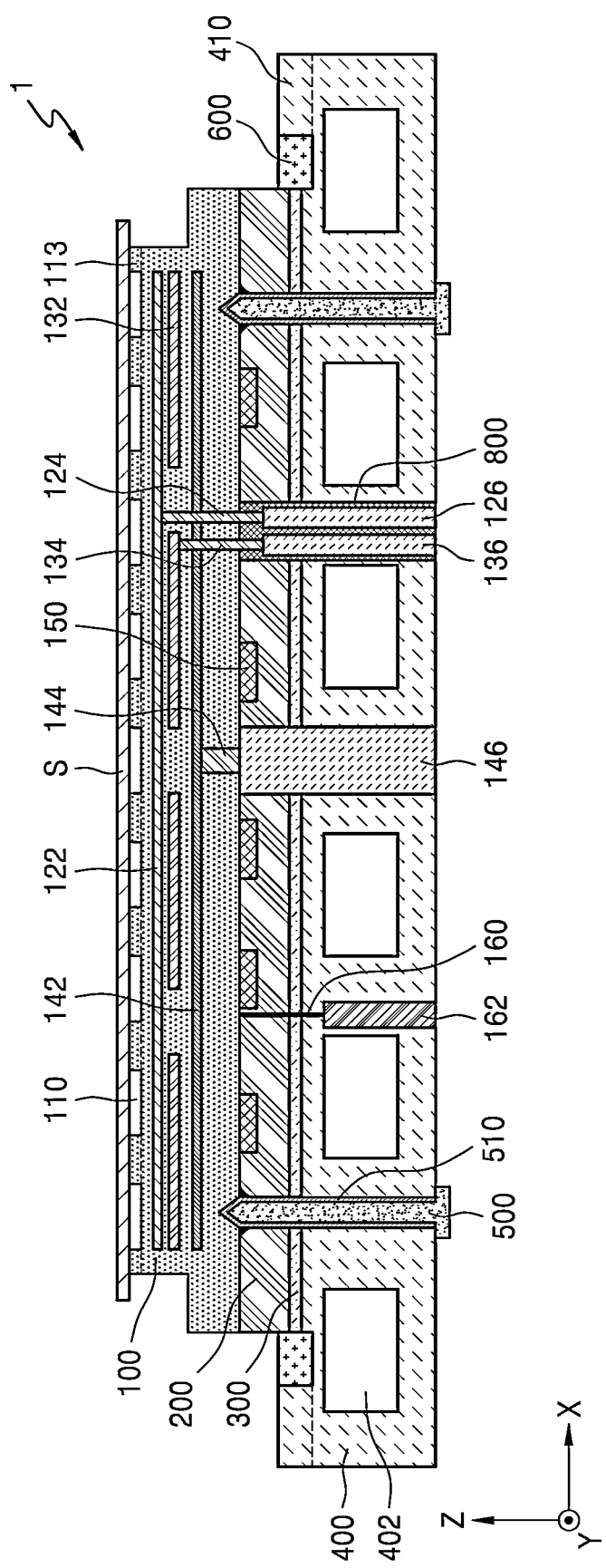
FIG. 1 is a cross-sectional view schematically illustrating a substrate processing apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described with reference to the accompanying drawings. However, the disclosure is not limited to the embodiments described below and may be implemented in various forms. The following embodiments are not provided to fully complete the disclosure, but rather to fully convey the scope of the disclosure to those skilled in the art.

FIG. 1 is a cross-sectional view schematically illustrating a substrate processing apparatus 1 according to an embodiment.

Referring to FIG. 1, the substrate processing apparatus 1 may include a support plate 100, a thermal insulation layer 200, a bonder 300, a base plate 400, and a housing 800.

According to an embodiment, the base plate 400 may be disposed under the support plate 100 configured to support a substrate S. In addition, the support plate 100 may be configured to support and fix a substrate S.

The support plate 100 may include a DC electrode 122 therein. The DC electrode 122 may generate electrostatic attraction between a substrate S and the support plate 100. The DC electrode 122 may be horizontally disposed inside the support plate 100 and may include a first electrode and a second electrode that are apart from each other and symmetrically arranged. The first electrode and the second electrode may serve as a positive electrode and a negative electrode, respectively. Therefore, a substrate S may be fixed to the support plate 100 by electrostatic attraction generated by a positive charge of the first electrode and a negative charge of the second electrode.

A portion of the support plate 100 surrounding the DC electrode 122 may include a dielectric material. The dielectric material may include a ceramic material. Examples of the ceramic material may include aluminum nitride (AlN), aluminum oxide ($Al_2O_3$), titanium nitride (TiN), titanium oxide (TiO), and silicon carbide (SiC).

A radio frequency (RF) layer 142 is electrically connected to an RF connector 144. The RF connector 144 is connected to an RF power source 146. The RF power source 146 may generate RF power. In this case, the RF power source 146 may be a high-bias-power source. A plurality of RF power sources may be provided by combining at least one selected from the group consisting of a high-frequency (27.12 MHz or more) power source, a medium-frequency (about 1 MHz to about 27.12 MHz) power source, and a low-frequency (about 100 kHz to about 1 MHz) power source. The RF layer 142 electrically connected to the RF power source 146 through the RF connector 144 may receive power from the RF power source 146 to form an electromagnetic field. The electromagnetic field formed by the RF layer 142 may form the first electrode and the second electrode inside the DC electrode 122, thereby causing the DC electrode 122 to generate electrostatic attraction. In addition, the DC electrode 122 may be electrically connected to a first control unit 126 through a first conductive wire 124. For example, the first control unit 126 may be configured to apply voltage to the DC electrode 120.

The support plate 100 may include a heating electrode 132 therein. The heating electrode 132 may be configured to uniformly and horizontally apply heat to a substrate S. The heating electrode 132 may be horizontally disposed inside the support plate 100. For example, the heating electrode 132 may have a radially symmetrical shape with respect to a center axis of the support plate 100. Therefore, the heating electrode 132 may uniformly apply heat to a substrate S regardless of the horizontal position of the substrate S. However, embodiments are not limited thereto. For example, portions of the heating electrode 132 may extend in one direction with a constant distance between adjacent portions.

The heating electrode 132 may be electrically connected to a second control unit 136 through a second conductive wire 134. For example, the second control unit 136 may be configured to apply voltage to the heating electrode 132.

The DC electrode 122 and the heating electrode 132 may be embedded in the support plate 100 at different vertical heights. For example, the DC electrode 122 may be horizontally disposed at a vertical position higher than the vertical position of the heating electrode 132, or the heating electrode 132 may be horizontally disposed at a vertical position higher than the vertical position of the DC electrode 122.

The base plate 400 may serve as a basic frame of the substrate processing apparatus 1. In some embodiments, the base plate 400 may include a cooling passage 402. The cooling passage 402 may provide a space in which a cooling fluid circulates. The cooling passage 402 may be provided inside the base plate 400 in a radially symmetrical form. The cooling fluid may be introduced into the cooling passage 402 through a transport tube (not shown), and a control unit (not shown) may control the circulation of the cooling fluid. For example, the cooling fluid may include helium (He).

The base plate 400 may include a material having higher thermal conductivity than the other members of the substrate processing apparatus 1. For example, the base plate 400 may include an aluminum alloy. Therefore, the base plate 400 may rapidly cool a lower portion of the substrate processing apparatus 1.

According to embodiments, the thermal insulation layer 200 may be disposed between the support plate 100 and the base plate 400, and the bonder 300 may bond the base plate 400 and the thermal insulation layer 200 to each other. In addition, the base plate 400 may further include a barrier 410 around a periphery of the base plate 400. A sealing member 600 may be disposed in a groove between the barrier 410 and the bonder 300 to prevent the bonder 300 from being etched.

The bonder 300 may have a layer shape and may be disposed on a lower end of the thermal insulation layer 200. The bonder 300 may be directly disposed on an upper end of the base plate 400, and the cooling fluid introduced into the cooling passage 402 may decrease the temperature of the bonder 300 or maintain the temperature of the bonder 300 at a constant value. The bonder 300 may include an organic bonder, and the organic bonder may include a silicone bonder.

The thermal insulation layer 200 may be disposed in a middle region of the substrate processing apparatus 1 having a stack structure to reduce heat exchange between upper and lower portions of the substrate processing apparatus 1. For example, the thermal insulation layer 200 may reduce heat transfer from the support plate 100 to the bonder 300. The thermal insulation layer 200 may include a material having lower thermal conductivity than the support plate 100 and the base plate 400. For example, the thermal insulation layer 200 may include cordierite.

According to embodiments, the housing 800 may accommodate the first conductive wire 124, the second conductive wire 134, the first control unit 126, and the second control unit 136. For example, the first conductive wire 124 and the second conductive wire 124 may be electrically insulated from each other and may be accommodated in the housing 800. In addition, the housing 800 may vertically penetrate a portion of the substrate processing apparatus 1 and may be disposed in the substrate processing apparatus 1.

FIGS. 2 to 8 are views schematically illustrating a process of fastening a bolt 500 to the base plate 400.

Figure 2:
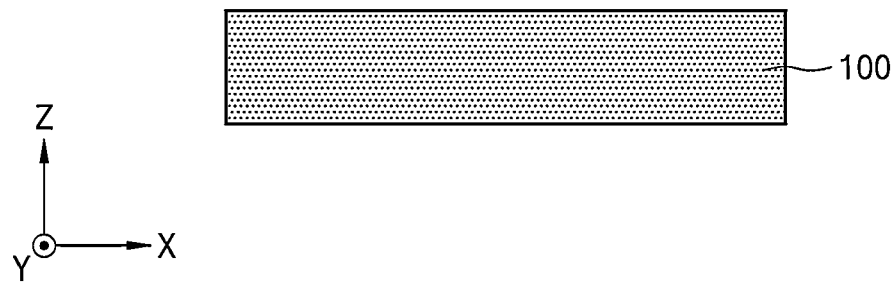
FIGS. 2 to 8 are views schematically illustrating a process of fastening a bolt to a base plate.
Figure 3:
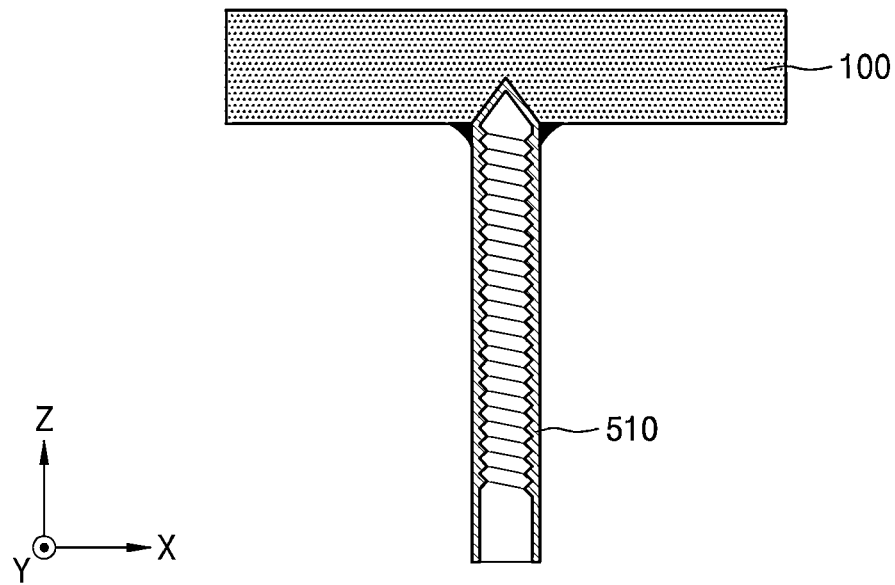

Referring to FIGS. 2 and 3, a tube 510 may be brazed to a lower end of the support plate 100 of the substrate processing apparatus 1. The tube 510 may have a shape such as a knife block having an internal thread. The tube 510 may include a metallic material to facilitate brazing.

Figure 4:
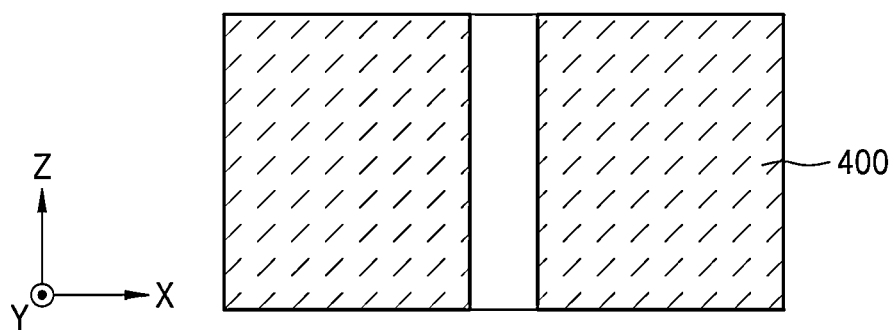
Figure 5:
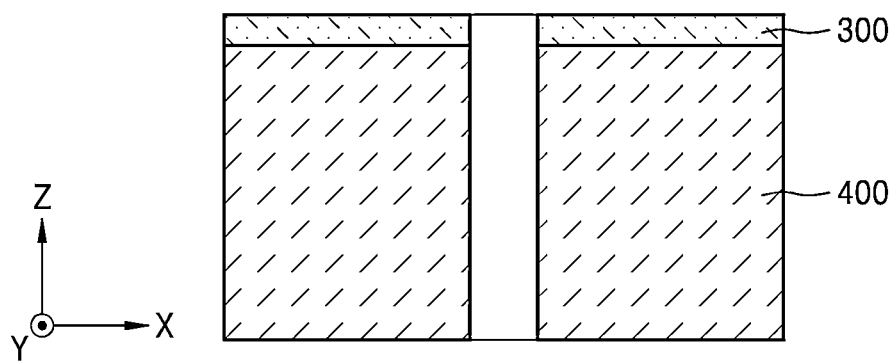
Figure 6:
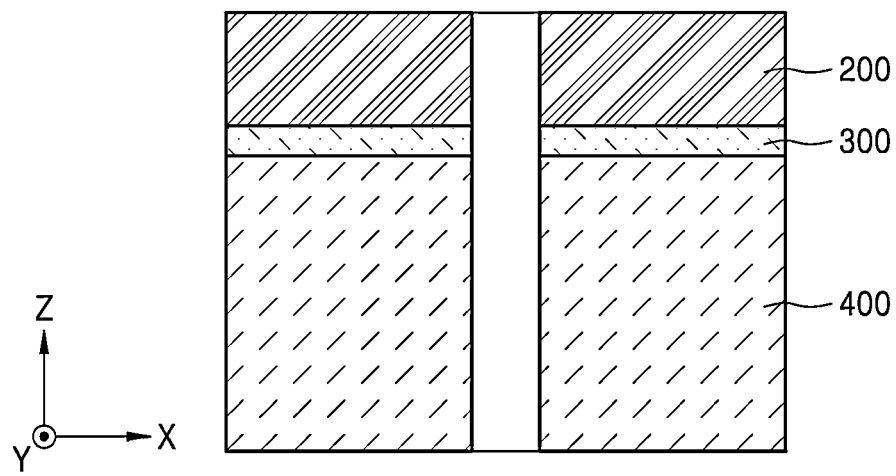

Referring to FIGS. 4 to 6, the thermal insulation layer 200 is disposed above the base plate 400 that has a center hole for coupling with the tube 510. In this case, the bonder 300 may be bonded to the upper end of the base plate 400 to bond the thermal insulation layer 200 to the base plate 400. Holes for coupling with the tube 510 may also be formed in a center portion of the thermal insulation layer 200 and a center portion of the bonder 300.

Figure 7:
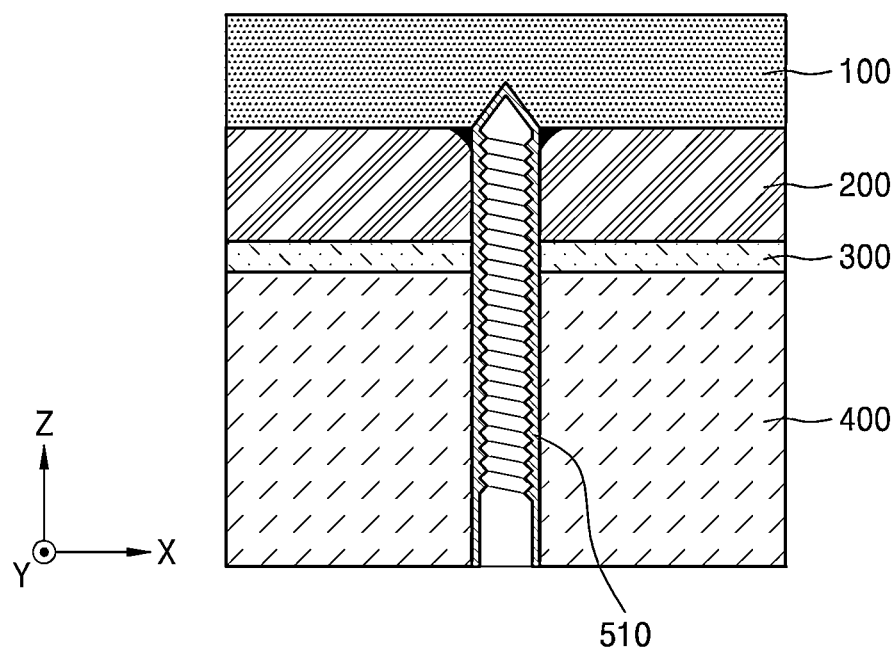

Referring to FIG. 7, the support plate 100 to which the tube 510 is brazed at the lower end of the support plate 100 may form coupled layers together with the thermal insulation layer 200, the bonder 300, and the base plate 400. In this case, the tube 510 may be inserted into the holes of the coupled layers.

Figure 8:
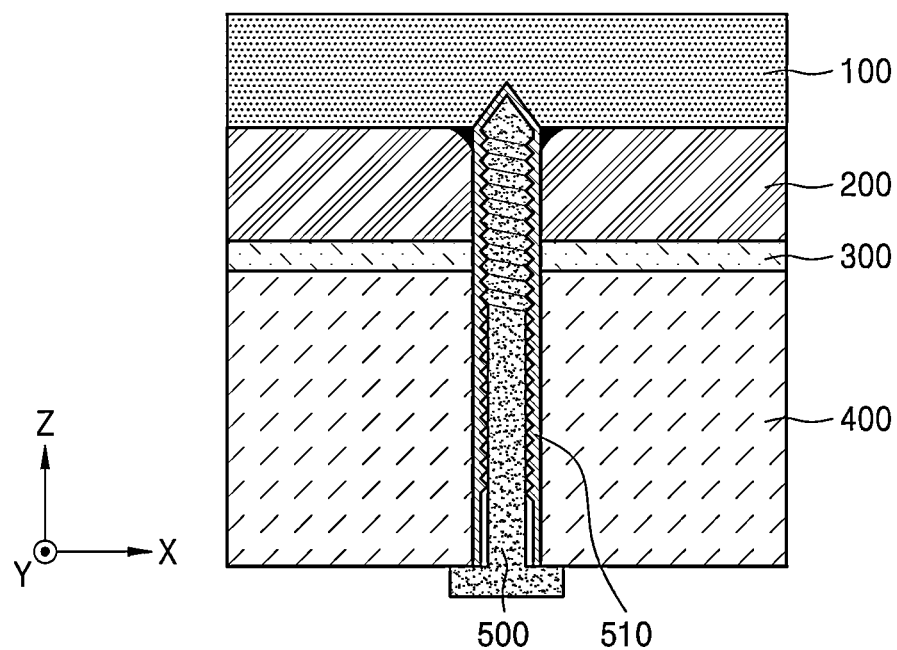

Referring to FIG. 8, the bolt 500 may be fastened to the tube 510 which is brazed to the lower end of the support plate 100. In this case, owing to the bolt 500, the thermal insulation layer 200 may be coupled to the support plate 100 in a state in which the thermal insulation layer 200 is completely in tight contact with a lower end surface of the support plate 100.

The bonder 300 including an organic material may be bent or the adhesion of the bonder 300 may decrease because of heat-resistance characteristics or thermal expansion of the bonder 300. Therefore, the support plate 100 and the thermal insulation layer 200, which may directly receive heat from the heating electrode 132 or the outside of a substrate S, are mechanically coupled to each other using the bolt 500 instead of using the bonder 300 including an organic material. In this case, the bolt 500 is inserted from a lower end surface of the base plate 400. As the bolt 500 is fastened to the tube 510 brazed to the lower end of the support plate 100, the base plate 400 is pressed upward, and thus surfaces of the thermal insulation layer 200 and the support plate 100 may be completely in tight contact with each other.

Figure 9:
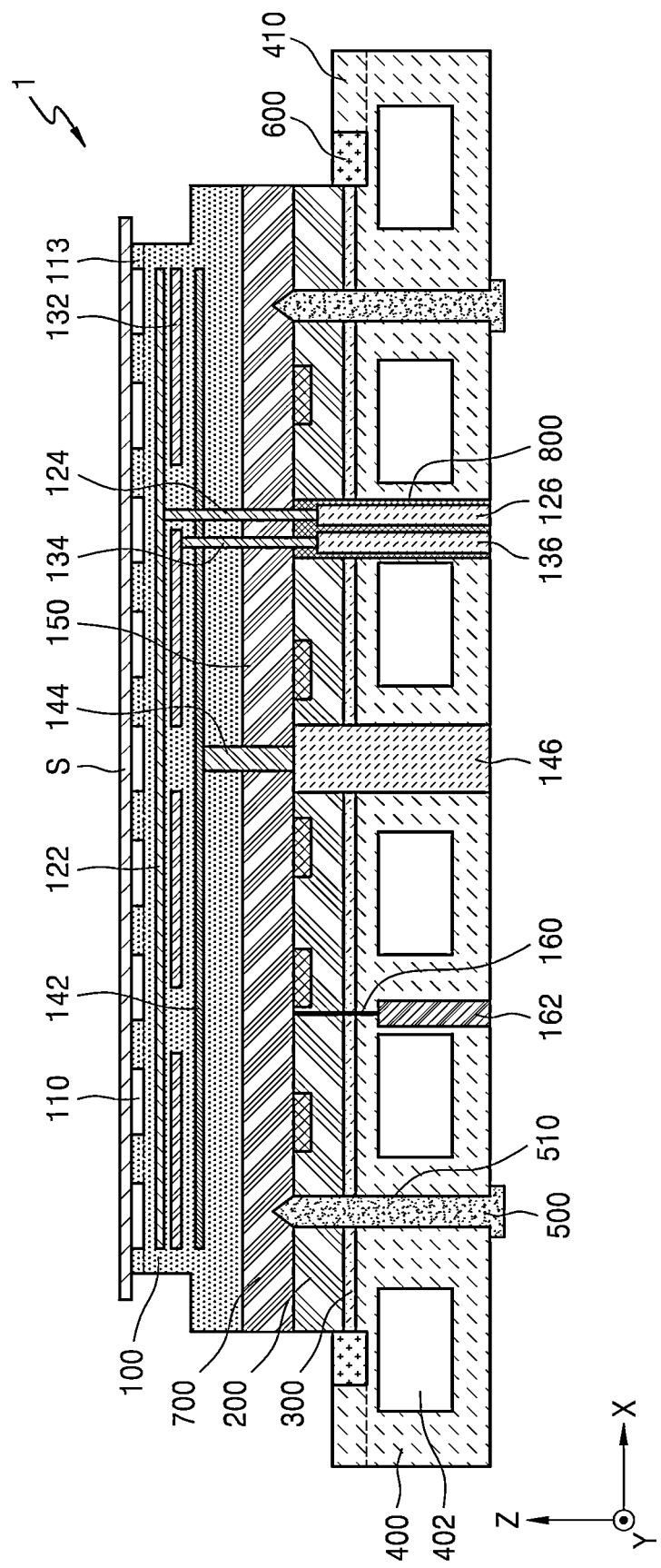
FIG. 9 is a cross-sectional view schematically illustrating a substrate processing apparatus according to another embodiment.

FIG. 9 is a cross-sectional view schematically illustrating a substrate processing apparatus 1 according to another embodiment.

Referring to FIG. 9, in the current embodiment, a base plate 400 may be disposed under a support plate 100 configured to support a substrate S. In addition, the support plate 100 may be configured to support and fix a substrate S. In addition, a thermal insulation layer 200 may be disposed between the support plate 100 and the base plate 400, and a bonder 300 may bond the base plate 400 and the thermal insulation layer 200 to each other. In addition, a mechanical joint layer 700 may be brazed to a lower end of the support plate 100. Unlike in the embodiment shown in FIG. 1, in the embodiment shown in FIG. 9, tubes are not installed in the mechanical joint layer 700, the thermal insulation layer 200, the bonder 300, and the base plate 400, but threaded holes for coupling with bolts 500 may be formed in the mechanical joint layer 700, the thermal insulation layer 200, the bonder 300, and the base plate 400. Therefore, as bolts 500 are fastened to the mechanical joint layer 700, the thermal insulation layer 200, the bonder 300, and the base plate 400, the base plate 400 may be pressed upward, and thus surfaces of the thermal insulation layer 200 and the support plate 100 may be completely in tight contact with each other.

Figure 10:
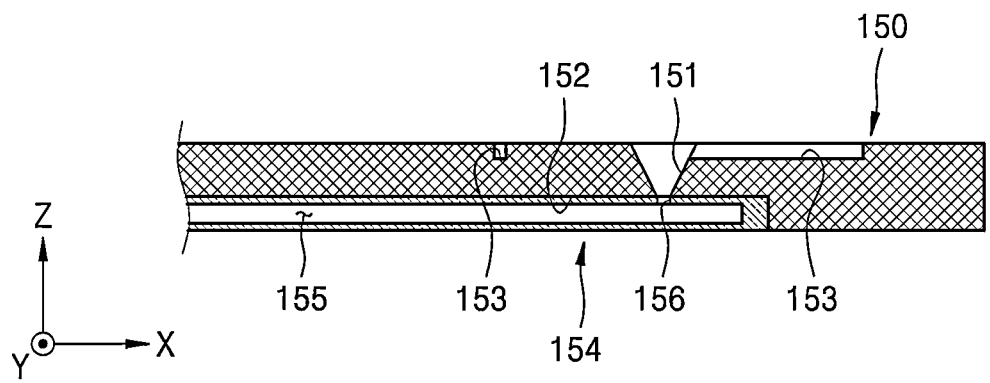
FIG. 10 is a cross-sectional view schematically illustrating a vacuum chuck of the substrate processing apparatus shown in FIG. 1.

FIG. 10 is a cross-sectional view schematically illustrating a vacuum chuck 150 of the substrate processing apparatus 1 shown in FIG. 1.

Figure 11:
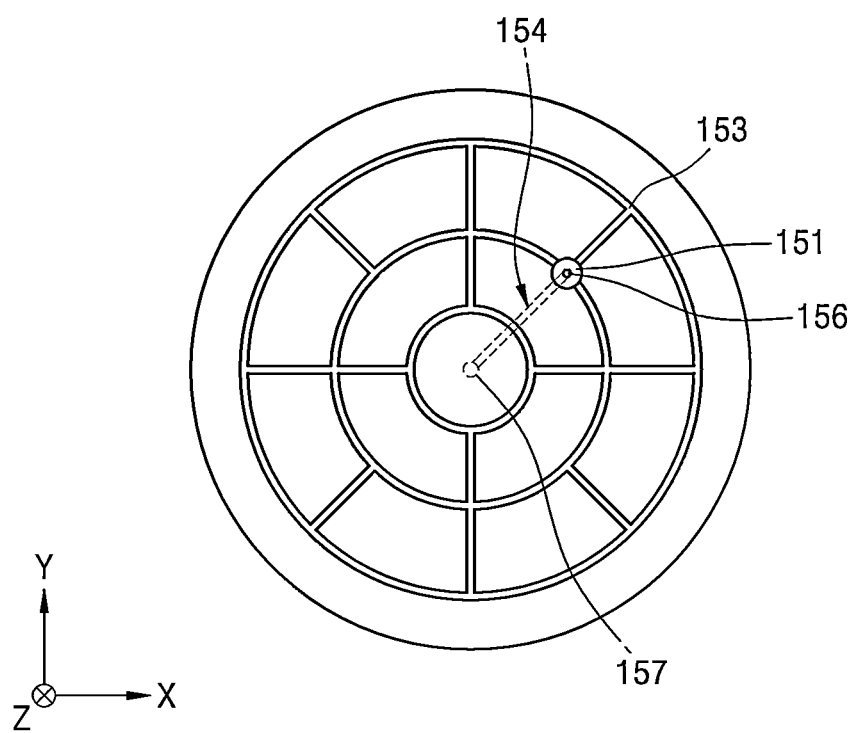
FIG. 11 is a plan view illustrating the vacuum chuck of the substrate processing apparatus shown in FIG. 1.

FIG. 11 is a plan view illustrating the vacuum chuck 150 of the substrate processing apparatus 1 shown in FIG. 1. The vacuum chuck 150 will now be described with reference to FIGS. 10, 11, and 1 together.

Referring to FIGS. 10, 11 and 1, at least one vacuum chuck 150 may be installed on an upper end of the thermal insulation layer 200 such that the mechanical coupling that is formed by using bolts 500 between the support plate 100 and the thermal insulation layer 200 may be complemented by the vacuum chuck 50.

The vacuum chuck 150 may include at least one suction hole 151 and an insertion groove 152 communicating with the suction hole 151 to fix the support plate 100 to an upper surface of the vacuum chuck 150 by vacuum suction. In addition, the vacuum chuck 150 may include a vacuum hob portion 153, which is formed concavely in the upper surface of the vacuum chuck 150 and communicates with the suction hole 151 to vacuum suction a substrate S.

In addition, the vacuum chuck 150 may include: a vacuum passage 155; and a vacuum tube 154 installed in the insertion groove 152 to allow the vacuum passage 155 to communicate with the suction hole 151. A pump pipe 160 may communicate with the vacuum passage 155 formed in the vacuum chuck 150 to form a vacuum pressure in the vacuum passage 155 and the suction hole 151. In this case, a vacuum pump 162 may adjust the vacuum pressure of the vacuum chuck 150 through the pump pipe 160.

The vacuum tube 154 may include a communication hole 156 through which the suction hole 151 and the vacuum passage 155 communicate with each other.

The suction hole 151 may have a truncated cone shape having an upwardly increasing cross-sectional area to provide vacuum pressure to a wide area of the support plate 100. In addition, as described above, the suction hole 151 may communicate with the vacuum passage 155 through the vacuum tube 154, and thus vacuum pressure applied through the vacuum passage 155 may be transmitted to the support plate 100 through the suction hole 151.

Figure 12:
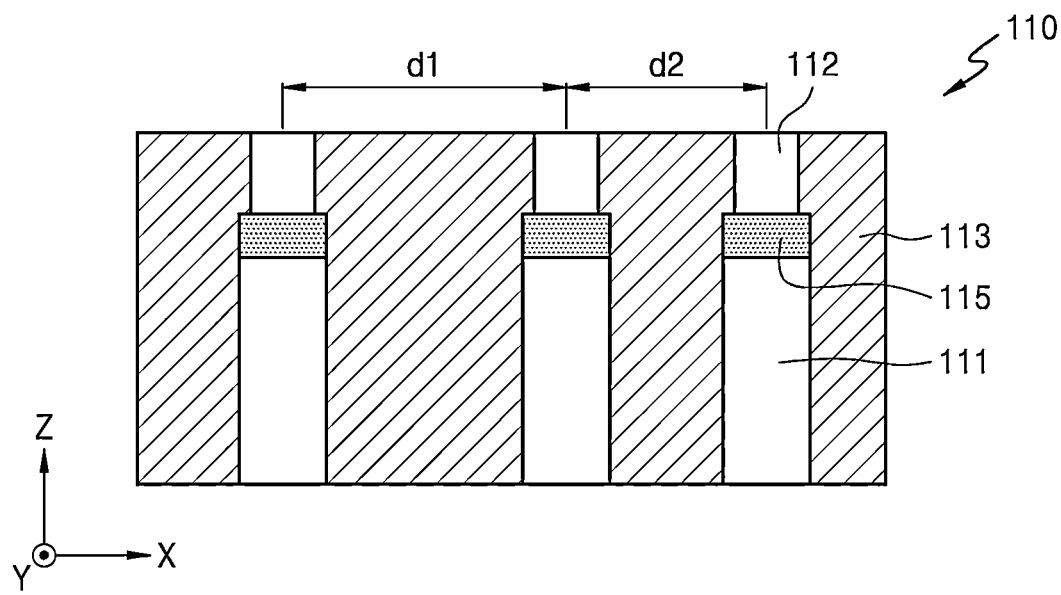
FIG. 12 is a cross-sectional view schematically illustrating gas supply holes of the substrate processing apparatus shown in FIG. 1.

FIG. 12 is a cross-sectional view schematically illustrating gas supply holes 110 of the substrate processing apparatus 1 shown in FIG. 1.

Figure 13:
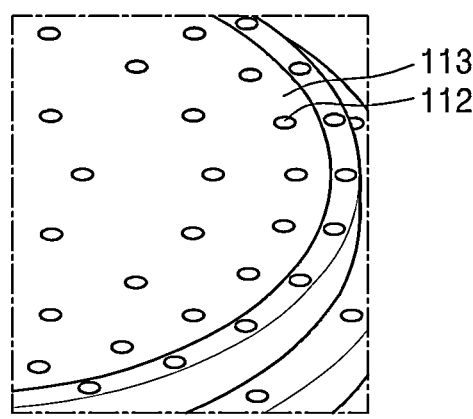
FIG. 13 is a plan view schematically illustrating upper ends of the gas supply holes of the substrate processing apparatus shown in FIG. 1.

FIG. 13 is a plan view schematically illustrating upper ends of the gas supply holes 110 of the substrate processing apparatus 1 shown in FIG. 1. The gas supply holes 110 will now be described with reference to FIGS. 12, 13, and 1 together.

Referring to FIGS. 12 and 13, one or more gas supply holes 110 may be formed in the support plate 100 to supply a temperature control gas. Second gas supply holes 112 may be positioned at a lower side of a substrate S suctioned onto the support plate 100. First gas supply hole 111 may communicate with the second gas supply holes 112 through porous bodies 115. A dam 113 may be provided radially and symmetrically with respect to the center axis of the support plate 100. The first gas supply holes 111 and the second gas supply holes 112 are horizontally surrounded by the dam 113.

In addition, as shown in FIG. 12, the second gas supply holes 112 may be arranged at irregular intervals from each other. For example, when the distance between adjacent second gas supply holes 112 is referred to as d1 and the distance between other adjacent second gas supply holes 112 is referred to as d2, d1 and d2 may be different from each other.

When a cooling gas is supplied through the first gas supply holes 111 in a state in which a substrate S is held on the support plate 100 by suctioning the substrate S, the cooling gas may be transferred to a lower surface of the substrate S through the second gas supply holes 112 communicating with the first gas supply holes 111, and the substrate S may be directly cooled by the cooling gas transferred thereto. The cooling gas may be introduced into the first gas supply holes 111 through a first transport tube (not shown), and a third control unit (not shown) may control circulation of the cooling gas. For example, a gas such as helium (He) may be provided as the cooling gas, but embodiments are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a support plate configured to support a substrate;
a base plate under the support plate;
a thermal insulation layer between the support plate and the base plate; and
a bonder bonding the base plate and the thermal insulation layer to each other,
wherein the thermal insulation layer is brought into tight contact with a lower end surface of the support plate by using a bolt,
wherein a tube comprising an internal thread is brazed to a lower end of the support plate, and the bolt is fastened to the tube,
wherein the tube extends from a recess of the support plate to a lower surface of the base plate,
wherein the tube has threads provided on the inside of the tube, and
wherein the bonder is an organic bonder including silicon.

2. The substrate processing apparatus of claim 1, wherein the support plate comprises a DC electrode configured to fix the substrate supported on an upper end of the support plate by using electrostatic force.

3. The substrate processing apparatus of claim 1, wherein the support plate comprises a radio frequency (RF) layer configured to form an electromagnetic field by receiving power from an RF power source.

4. The substrate processing apparatus of claim 1, wherein the support plate comprises a ceramic material.

5. The substrate processing apparatus of claim 1, wherein the support plate comprises at least one gas supply hole to supply a temperature control gas through the at least one gas supply hole, and
the at least one gas supply hole is horizontally surrounded by a dam.

6. The substrate processing apparatus of claim 1, wherein at least one suction hole is formed in an upper end of the thermal insulation layer to fix the support plate by vacuum suction,
wherein the substrate processing apparatus further comprises a vacuum pump communicating with the at least one suction hole to form a vacuum pressure in the at least one suction hole.

7. A substrate processing apparatus comprising:
a support plate configured to support a substrate;
a base plate under the support plate;
a thermal insulation layer between the support plate and the base plate; and
a bonder bonding the base plate and the thermal insulation layer to each other,
wherein the thermal insulation layer is brought into tight contact with the support plate by using a bolt, and
the support plate comprises a plurality of heating electrodes that are laterally arranged,
wherein a tube comprising an internal thread is brazed to a lower end of the support plate, and the bolt is fastened to the tube,
wherein the tube extends from a recess of the support plate to a lower surface of the base plate,
wherein the tube has threads provided on the inside of the tube, and
wherein the bonder is an organic bonder including silicon.

8. The substrate processing apparatus of claim 7, wherein the support plate further comprises a DC electrode configured to fix the substrate supported on an upper end of the support plate by using electrostatic force.

9. The substrate processing apparatus of claim 7, wherein the support plate further comprises a radio frequency (RF) layer configured to form an electromagnetic field by receiving power from an RF power source.

10. The substrate processing apparatus of claim 7, wherein the support plate further comprises a ceramic material.

11. The substrate processing apparatus of claim 7, wherein the support plate further comprises at least one gas supply hole to supply a temperature control gas through the at least one gas supply hole, and
the at least one gas supply hole is horizontally surrounded by a dam.

12. The substrate processing apparatus of claim 7, wherein at least one suction hole is formed in an upper end of the thermal insulation layer to fix the support plate by vacuum suction,
wherein the substrate processing apparatus further comprises a vacuum pump communicating with the at least one suction hole to form a vacuum pressure in the at least one suction hole.

13. A substrate processing device comprising:
a support plate configured to support a substrate;
a base plate under the support plate, the base plate including a threaded hole formed therein;
a thermal insulation layer between the support plate and the base plate, the thermal insulation layer including a threaded hole formed therein;
a bonder bonding the base plate and the thermal insulation layer to each other; and
a mechanical joint layer brazed to a lower end surface of the support plate, the mechanical joint layer including a threaded hole formed therein,
wherein the thermal insulation layer is brought into tight contact with a lower end surface of the mechanical joint layer by using a bolt coupled with the threaded hole in each of the base plate, the thermal insulation layer, and the mechanical joint layer,
wherein the bonder is an organic bonder including silicon.

14. The substrate processing device of claim 13, wherein the support plate comprises a DC electrode configured to fix the substrate supported on an upper end of the support plate by using electrostatic force.

15. The substrate processing device of claim 13, wherein the support plate comprises a radio frequency (RF) layer configured to form an electromagnetic field by receiving power from an RF power source.

16. The substrate processing device of claim 13, wherein the support plate comprises a ceramic material.

17. The substrate processing device of claim 13, wherein the support plate comprises at least one gas supply hole to supply a temperature control gas through the at least one gas supply hole, and
the at least one gas supply hole is horizontally surrounded by a dam.

18. The substrate processing device of claim 13, wherein at least one suction hole is formed in an upper end of the thermal insulation layer to fix the support plate by vacuum suction,
wherein the substrate processing apparatus further comprises a vacuum pump communicating with the at least one suction hole to form a vacuum pressure in the at least one suction hole.

* * * * *